United States Patent [19]
Buehler et al.

[11] Patent Number: 5,331,164
[45] Date of Patent: Jul. 19, 1994

[54] PARTICLE SENSOR ARRAY

[75] Inventors: Martin G. Buehler, La Canada; Brent R. Blaes, San Dimas; Udo Lieneweg, Altadena, all of Calif.

[73] Assignee: California Institute of Technology, Pasadena, Calif.

[21] Appl. No.: 672,705

[22] Filed: Mar. 19, 1991

[51] Int. Cl.[5] ............................................. H01L 29/78
[52] U.S. Cl. ................................. 250/370.02; 257/429
[58] Field of Search ................... 250/370.02; 257/429, 257/290, 291, 292

[56] References Cited

U.S. PATENT DOCUMENTS

| | | |
|---|---|---|
| 3,570,112 | 3/1971 | Barry et al. |
| 4,132,904 | 1/1979 | Harari. |
| 4,300,212 | 11/1981 | Simko. |
| 4,473,836 | 9/1984 | Chamberlain. |
| 4,549,088 | 10/1985 | Ozawa. |
| 4,613,881 | 9/1986 | Nishizawa. |
| 4,651,015 | 3/1987 | Nishizawa et al. |
| 4,685,195 | 8/1987 | Szydlo et al. |
| 4,686,555 | 8/1987 | Yusa et al. |
| 4,733,286 | 3/1988 | Matsumoto. |
| 4,808,834 | 2/1989 | Kimata ............................. 257/290 |
| 4,996,576 | 2/1991 | Lynch et al. ..................... 257/429 |

FOREIGN PATENT DOCUMENTS 61-3590844  5/1984  Japan .................... 257/429
60-18957  1/1985  Japan .

Primary Examiner—Paul M. Dzierzynski
Assistant Examiner—Richard Hanig
Attorney, Agent, or Firm—Leonard Tachner

[57] ABSTRACT

A particle sensor array which in a preferred embodiment comprises a static random access memory having a plurality of ion-sensitive memory cells, each such cell comprising at least one pull-down field effect transistor having a sensitive drain surface area (such as by bloating) and at least one pull-up field effect transistor having a source connected to an offset voltage. The sensitive drain surface area and the offset voltage are selected for memory cell upset by incident ions such as alpha-particles. The static random access memory of the present invention provides a means for selectively biasing the memory cells into the same state in which each of the sensitive drain surface areas is reverse biased and then selectively reducing the reversed bias on these sensitive drain surface areas for increasing the upset sensitivity of the cells to ions. The resulting selectively sensitive memory cells can be used in a number of applications. By way of example, the present invention can be used for measuring the linear energy transfer of ion particles, as well as a device for assessing the resistance of CMOS latches to Cosmic Ray induced single event upsets. The sensor of the present invention can also be used to determine the uniformity of an ion beam.

3 Claims, 16 Drawing Sheets

☐ CELL CROSS-SECTION AT 2.4V    ⌐ ¬ AT 2.0 V
                                                              L ⌐

DEPOSITED CHARGE
Q (fC)

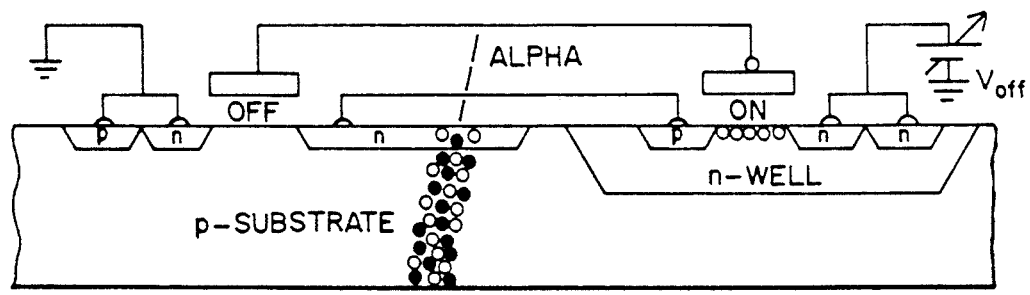
FIG. 20a
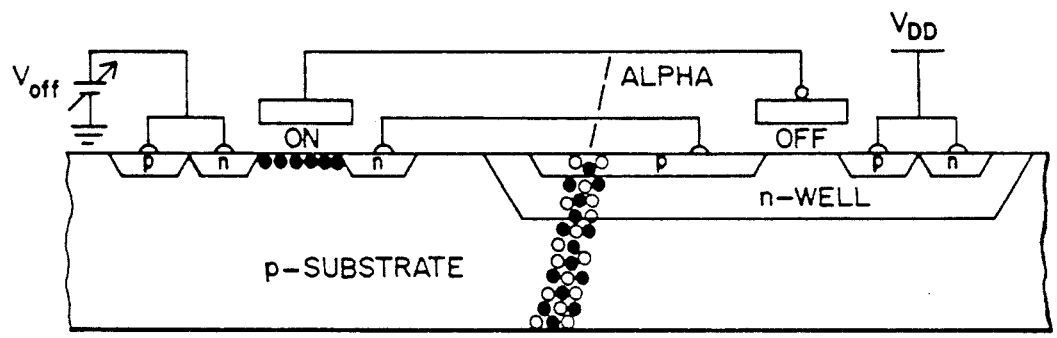
FIG. 20b
FIG. 22
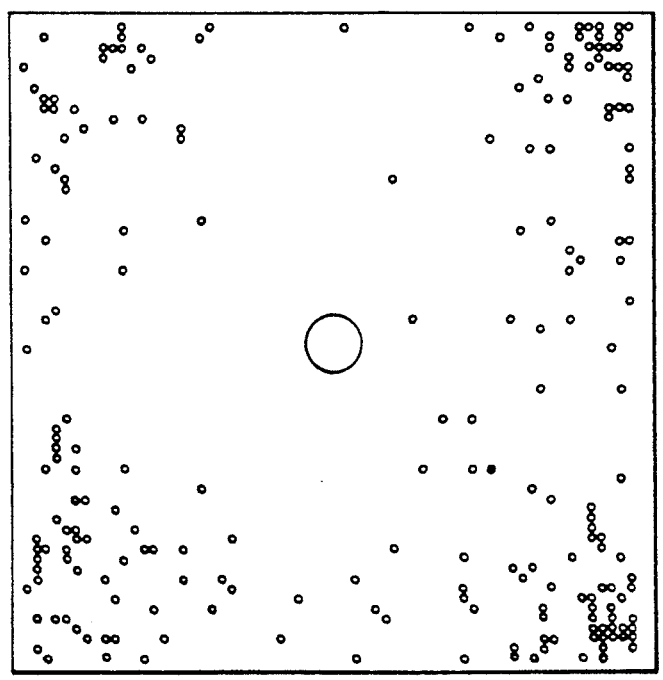

PARTICLE SENSOR ARRAY

ORIGIN OF INVENTION

The invention described herein was made in the performance of work under a NASA Contract, and is subject to the provisions of Public Law 96-517 (35 USC 202) in which the Contractor has elected to retain title.

TECHNICAL FIELD

The present invention relates to a particle sensor array in the configuration of a static random access memory that is sensitive to charged particles with an atomic mass greater than or equal to 1. Such an invention can be used as a gas densitometer, a position detector, a particle beam detector, as an aid in circuit fabrication, as a means of evaluating memory-cell upset resistance of space-craft components and in other fields.

BACKGROUND ART

The trend in electronic components has lead to the development of integrated circuits (ICs) that have higher operating frequencies and require less power per gate. This has been achieved in part by a reduction in the feature sizes that make up the transistors and wires that comprise the ICs. As a consequence, the amount of charge that is required to store a bit of information is about one-tenth of a pico-coulomb (pC), or about 600,000 electrons. Because the amount of charge is so small, cosmic rays can deposit enough charge in an IC to cause a single-event upset (SEU) and alter the state of the memory bit.

The importance of cosmic rays on the performance of integrated circuits in a space environment is evident in the upset rates of various satellites and spacecraft. For example, the Tracking and Data Relay satellite experiences a single event upset per day, which must be corrected from the ground. Such adverse experiences have caused a re-design of spacecraft, such as the Galileo spacecraft. The characterization of static random access memories or SRAMs, due to ion induced upsets is essential to evaluating the susceptibility of SRAMs and application-specific integrated circuit (ASIC) registers to cosmic ray upsets. This characterization usually requires evaluations at an ion source, such as a cyclotron. Such evaluations are time consuming, expensive and error prone. In recent years, laser pulses have been proposed as substitutes for the heavy ion sources. However, the laser simulations are limited by metal layers that frequently block the laser pulses from SEU-sensitive nodes and by the complexity of the ion-photon calibrations. The solution to the single event upset problem continues to be important, as the complexity of spacecraft grows, the size of integrated circuits decrease and as space systems are designed with circuits fabricated at non-radiation hardened foundries.

For present day ICs in a 10% worse case cosmic ray environment, the upset rate is in the $10^{-8}$ to $10^{-4}$ SEUs per bit-day range. This means that a spacecraft with $10^8$ bits of memory would experience between 1 and 10,000 upsets per day 90% of the time. But 10% of the time, the upset rate would be higher.

The upset of a semiconductor memory cell by an ion, caused by cosmic rays or other sources, depends on the charge deposited in the sensitive regions of the memory cell. The sensitive regions are found at reverse biased junctions whose charge can be dissipated by an ion strike. The sensitivity of the cell to upset can be influenced through cell layout, fabrication, and operating characteristics. Each of these factors influences the critical charge (minimum required charge to cause cell upset) through the cell nodal capacitance, the p-n junction parameters, and/or the transistor parameters. The passage of an ion through the cell creates hole-electron pairs which can deposit enough charge to short out sensitive junctions and cause the cell to change state. The amount of charge deposited depends on a number of factors, including the ion type, energy, incident angle, and capture cross-section of the cell.

Much progress has been made in the hardening of static random access memory cells against cosmic ray induced SEUs. In recent years, cross-coupled resistors have been introduced into the six-transistor SRAM cell to reduce the SEUs. Most recently, an engineering design equation, termed the Petersen Equation, has been developed that relates the transistor critical charge and junction area and the 10% worst case cosmic ray spectrum to the expected upset rate of SRAMs in an earth orbit.

The upset rate R (in upsets/bit-day) as given by the Petersen Equation is $$R = 5 \times 10^{-10} A(\mu m^2) [D_c(\mu m)/Q_c(pC)]^2,$$

where for a 10% worst case cosmic ray (an ion) spectrum A is the cell cross-section, DC is the collection depth and $Q_c$ is the critical charge. An improved device is required to characterize the coefficients found in the Petersen Equation so that spaceborne ASICs, fabricated along with the test device, will be designed to have maximum protection against SEUs.

SUMMARY OF THE INVENTION

In a preferred embodiment, the present invention comprises a conventional six-transistor memory cell made sensitive to heavy ions by bloating the drain and by placing an offset voltage on the source of selected transistors in the memory cell. While SRAMs are not new in the art, they have not previously been designed to be sensitive to ions. The uniqueness of this "sensor" is found in the offset voltage that allows the cell to be sensitized so that it can be upset by ions, such as alpha-particles. In fact, the six-transistor cell SRAMs of the present invention are designed to be easily upset by a laboratory ion source. This simulation closely emulates the cosmic ray upset of SRAMs. In the experiments conducted with such six-transistor cell SRAM reductions-to-practice of the present invention, a Polonium 208 and Americum 241 alpha-particle source was used to upset the SRAM chip. The cells of the SRAM chip were designed with an offset voltage which controls the critical charge needed to upset the cells.

The basic design of the cells of the present invention comprises a detector inverter connected to a feedback inverter, forming an inner loop that is connected through switches to bit-lines, the switches being activated by means of a word line. The cells are arranged in columns and accessed by turning on the switches by means of the word lines which connect the inverters to the bit-lines. In operation, the cell is biased into the sensitive state, by turning the switches "ON", forcing the cell to assume a state as dictated by the bias on the bit-lines. During this "write" cycle, the offset voltage is set to ground in this embodiment. Then the switches are turned "off" and the offset voltage is set so that the cell is sensitized. During this time, the "stare" time, the cells can be upset by an ion. At the end of this "stare" time, the offset voltage is set to ground, then the state of the cell is "read", by again turning the switches "ON", which sets the bias on the bit-lines. The bias on the bit-lines is then read via an on-chip sense amplifier.

As a densitometer, this invention can determine the density of a medium positioned between the detector and a radiation source. The device has also been shown to determine air pressure. The device can be used as a position detector as well, and in addition, the device has been used to determine the outline of masks placed over it. The device has also been demonstrated as a particle beam uniformity detector. In addition, the device can be used to discriminate between the linear energy transfer (LET) of particles. In addition, it has been proposed to fly banks of the memory cells of the invention to evaluate the cosmic ray spectrum. The memory cells of the present invention can also be used as a standard evaluation circuit to characterize the quality of circuit fabrication. The concepts, as applied to the SRAMs of the present invention, can be extended to aid analysis of circuit elements, such as latches.

OBJECTS OF THE INVENTION

It is therefore a principal object of the present invention to provide a particle sensor array in the form of a static random access memory (SRAM), made sensitive to ions through the use of a cell offset voltage.

It is an additional object of the present invention to provide a particle sensor array in the form of a static random access memory, which can provide highly accurate measurements of fluid density, can be used as a position sensor, can be used as a linear energy transfer spectrometer and as a linear energy transfer telescope.

It is an additional object of the present invention to provide a particle sensor array in the form of a static random access memory that can be used as a detector for determining the density of a medium positioned between the detector and a radiation source.

It is still an additional object of the present invention to provide a particle sensor array in the form of a static random access memory which can be used to determine the position of masks placed over a detector form of the present invention using a vernier method.

It is still an additional object of the present invention to provide a particle sensor array in the form of a static random access memory which can be used as a standard evaluation circuit to characterize the quality of circuit fabrication.

It is still an additional object of the present invention to provide a particle sensor array in the form of a static random access memory which has been made sensitive to ions by using a memory cell design having a bloated drain and a source offset voltage to provide alpha-particle sensitive test SRAMs.

It is still an additional object of the present invention to provide test SRAMs for characterizing alpha-particle tracks in CMOS/Bulk memories to enable precise estimates of upset rates of memories and latches due to Cosmic Ray strikes.

BRIEF DESCRIPTION OF THE DRAWINGS

The aforementioned objects and advantages of the present invention, as well as additional objects and advantages thereof, will become more apparent hereinafter as a result of a detailed description of a preferred embodiment of the invention, when taken in conjunction with the following drawings in which:

FIG. 20, comprising FIGS. 20a and 20b, illustrate two alternate embodiments of the present invention in cross-section of the detector inverter, wherein the embodiment of FIG. 20a corresponds to the schematic circuit of FIG. 7 and the embodiment of FIG. 20b corresponds to the schematic circuit of FIG. 9;

FIG. 21 is an alpha-particle incident-angle dependence upset-rate graph of an SRAM using the detector inverter illustrated in FIG. 20a;

FIG. 22 is a SRAM bit map showing alpha-particle incident-angle dependence bit-flip locations for a test SRAM where the detector inverter is that shown in cross-section in FIG. 20b;

DETAILED DESCRIPTION OF A PREFERRED EMBODIMENT

Figure 1:
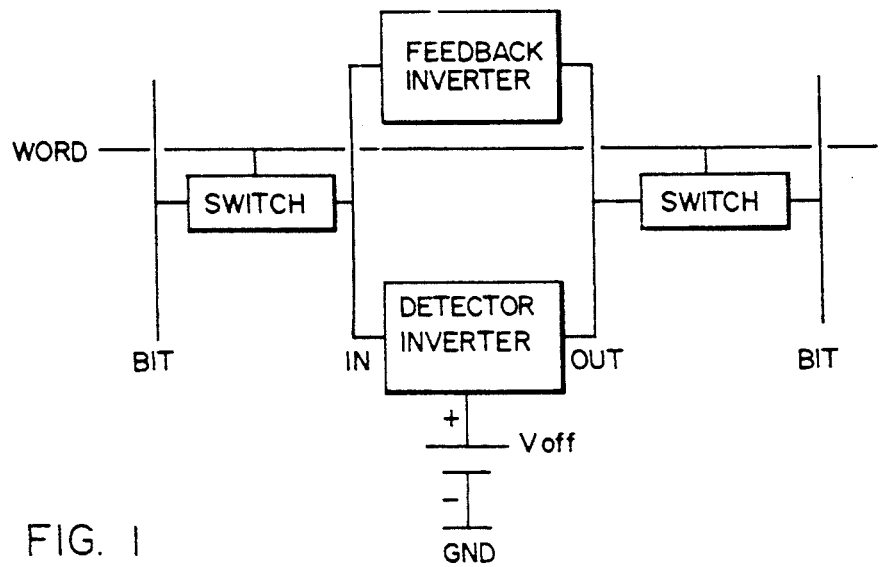
FIG. 1 is a block diagram of a particle sensor of the present invention.

The basic operational configuration of the present invention is illustrated in FIG. 1. As shown therein, the cell of the present invention consists of a detector inverter connected to a feedback inverter in the form of an inner-loop. This inner-loop is connected through switches to bit and bit-bar lines. The switches are activated by means of a word line. A combination of detector inverter, feedback inverter, switches, bit and bit-bar lines and word line, comprise a particle sensor cell. The principal unique characteristic of the sensor of the present invention is determined by the offset voltage, Voff, which allows the cell to be sensitized so that it can be upset by an ion such as an alpha-particle. The cells are arranged in columns and may be accessed by turning on the switches by means of the word lines which connect the inverters to the bit lines. One of the significant advantages of the detector of the present invention is that it can be produced using standard CMOS fabrication.

In operation, the cell of the present invention is biased into the sensitive state by turning the switches "ON", forcing the cell to assume a state dictated by the bias on the bit-lines. During this "WRITE" cycle, Voff is set to ground. The switches are then turned "OFF" and Voff is set so that the cell is sensitized. During this time, referred to herein as the "STARE" time, the cell can be upset by an ion. At the end of this "STARE" time, Voff is set to ground. Then, the state of the cell is "READ" by again turning the switches "ON" which sets the bias on the bit-lines. The bias on the bit-lines is then read by means of an on-chip sense amplifier.

Figure 2:
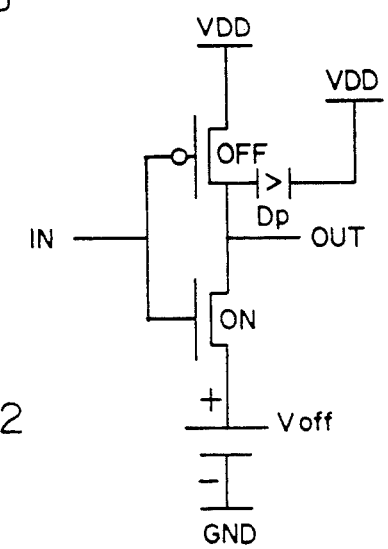
FIG. 2 is a schematic diagram of a detector inverter used in the present invention.

One design for the detector inverter of FIG. 1 is shown in FIG. 2 and is characterized by a pair of MOSFET transistors and a detector diode. The MOSFET transistors are labelled "OFF" and "ON", respectively.

The detector diode $D_p$ is biased through the "ON" MOSFET transistor. A particle is detected at the diode D p in a manner to be described in substantially more detail hereinafter.

Figure 3:
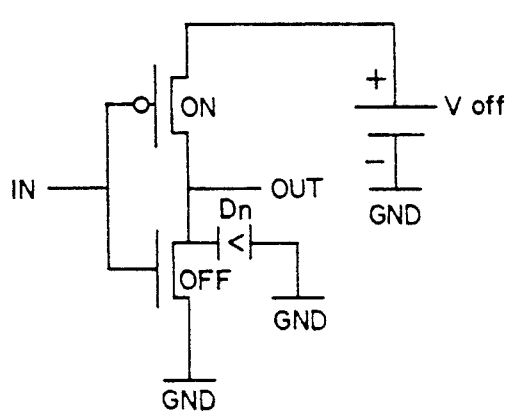
FIG. 3 is a schematic diagram of an alternative detector inverter that may be used in the present invention.
Figure 4:
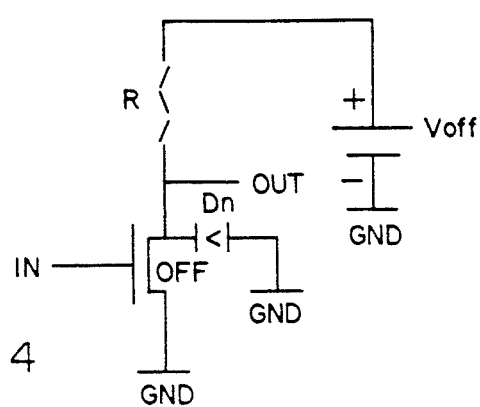
FIG. 4 is a schematic diagram of still an additional alternative detector inverter which may be used in the present invention.

An alternative approach for the design of the detector inverter is shown in FIGS. 3 and 4. In both of these configurations, the offset voltage Voff is biased to VDD in the "READ" or "WRITE" cycle and lowered to sensitize the cell in the "STARE" cycle. In FIG. 3, a particle is detected at the diode $D_n$ which is biased through the "ON" P-MOSFET transistor. In the configuration of FIG. 4, a particle is detected at the diode $D_n$ and the pull-up MOSFET shown in FIG. 3 is replaced by the load resistor R in FIG. 4.

The particle sensor of the present invention has a large number of potential applications. For example, it can be used as a densitometer. In this application, the detector can be used to determine the density of a medium positioned between the detector and a radiation source, This application is based on the use of the detector to determine air pressure, as will be described hereinafter. If the radiation source is positioned above the detector at the end of the detectable upset range in air, no upsets are detected in the detector. However, as the air is evacuated, the particles reach the detector and induce bit flips. An analysis of the alpha-particle SRAM pressure sensor is given in TABLE 1. It shows that a 16k-bit SRAM and a 100 μCi alpha source has a measurement error of $1.3 = \sqrt{N}/N$ percent for a measurement time of 20 milliseconds.

TABLE 1

| ERROR % | $\sqrt{N}$ | N #COUNTS | σ μm² | $N_t$ #CELL | φ alphas cm²s | μCi | $H_a$ mm | t sec | COMMENTS |
|---|---|---|---|---|---|---|---|---|---|
| 11 | 9 | 80 | 100 | 4096 | 200 | 1 | 32 | 100 | CURRENT DESIGN |
|  |  |  |  |  | 2E4 |  | 3 |  | MOVE SOURCE CLOSER FLUX GOES AS 1/R² |
|  |  |  |  |  | 2E6 | 100 |  |  | INCREASE STRENGTH |
|  |  |  | 1000 |  |  |  |  |  | INCREASE CELL AREA |
|  |  |  |  | 16K |  |  |  |  | INCREASE # CELLS |
| 1.8 | 56 | 3200 | 1000 | 16K | 2E6 |  |  | 0.01 | REDUCE MEASUREMENT TIME |
| 1.3 | 80 | 6400 | 1000 | 16K | 2E6 |  |  | 0.02 | INCREASE MEASUREMENT TIME |

$H_a$ is the height of the source above the SRAM.
EQUATION USED TO COMPUTE THE N-VALUES IN TABLE 1:

$$N(COUNTS) = \sigma(\mu m^2) \cdot N_t(CELLS) \cdot \phi \left[ \frac{alphas}{cm^2 \cdot sec} \right] \cdot t(sec) \cdot \frac{1}{10^8 (\mu m/cm)^2}$$

The present invention may also be used as a position detector. The detector can be used to determine the position of masks placed over the detector. Using straight edge masks, the position of the mask can be determined by a vernier method, as will be explained hereinafter in more detail.

The present invention may also be used as an angle detector. When the sensitive diodes are diffused into a "well", upsets are detected only for shallow angles. Particles which traverse the diode "well" structure normal to the surface, do not deposit enough charge to trip the cells because the "well" junction truncates the charge.

The present invention can also be used as a particle beam uniformity detector. More specifically, the detector array of the present invention can determine the uniformity of particle beams. This uniformity can be determined at the rate at which the memory can be read, which is less than one millisecond. The present invention can also be used as a linear energy transfer detector to discriminate between the linear energy transfer of particles. The linear energy transfer can be adjusted by varying the offset voltage and as such can be considered for spacecraft applications where banks of memory would be used to evaluate the cosmic ray spectrum. The present invention also has potential application as an aid in integrated circuit fabrication, namely in the fabrication of application specific integrated circuits. Specifically, the memory of the present invention can be used as a standard evaluation circuit to characterize the quality of circuit fabrication. The present invention can also be used to qualify the SEU hardness of circuit elements such as latches.

Figure 5A:
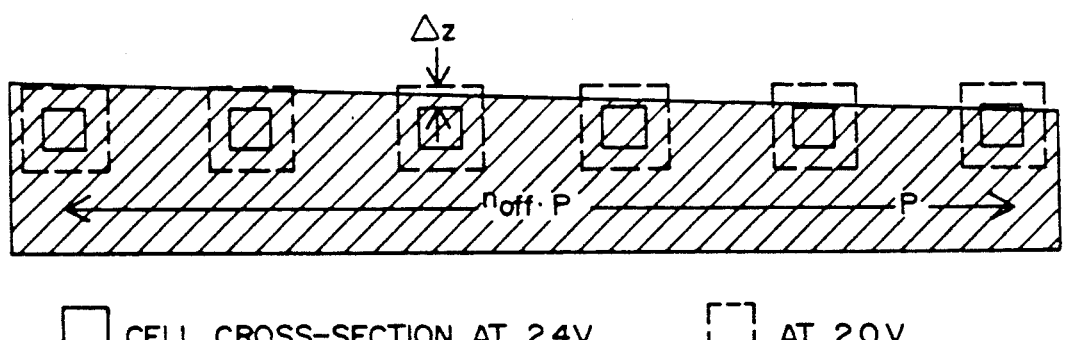
FIG. 5, consisting of FIGS. 5a and 5b, provides graphical representations of the mapping of alpha-particle sensitive areas in the present invention, using a vernier technique.
Figure 5B:
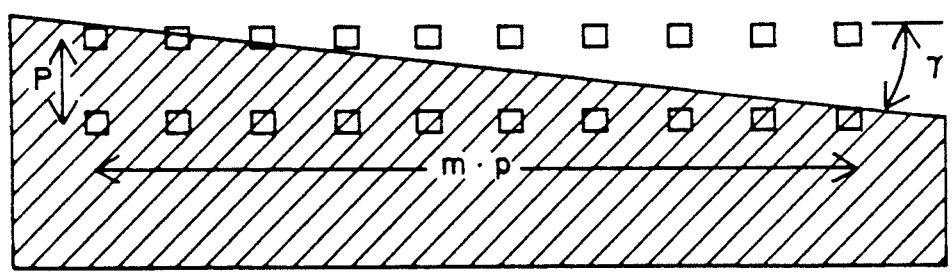
Figure 6:
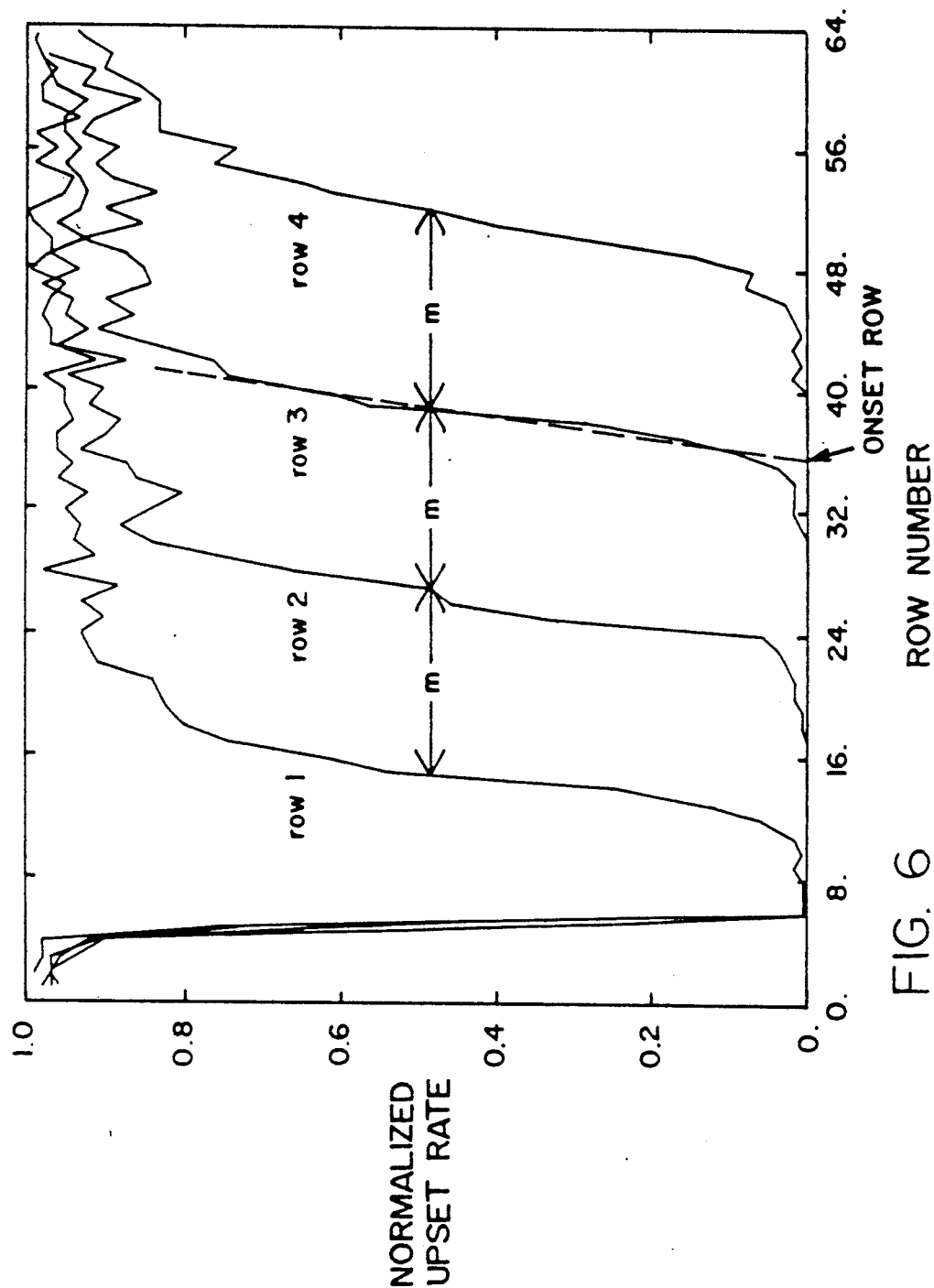
FIG. 6 illustrates the results of the vernier technique of FIG. 5.

Referring now to FIG. 5 and FIG. 6, it will be seen that the present invention facilitates a vernier technique for mapping alpha-particle sensitive areas in static memories. A 4096-bit test SRAM, fabricated in 2-$\mu$m N-well CMOS technology, was designed with memory cells that are sensitive to alpha-particle upset when written with "zeros". The test SRAM was designed with an enlarged drain for one of the n-MOSFETs and with an offset voltage connected to the source of the associated p-MOSFET. A cross-section is measured by placing a Po-208 source of known flux $\phi$ on top of the open chip-package and counting the flipped cells N after a time t using $N = 4096\sigma\phi t$ for $N << 4096$.

Figure 15:
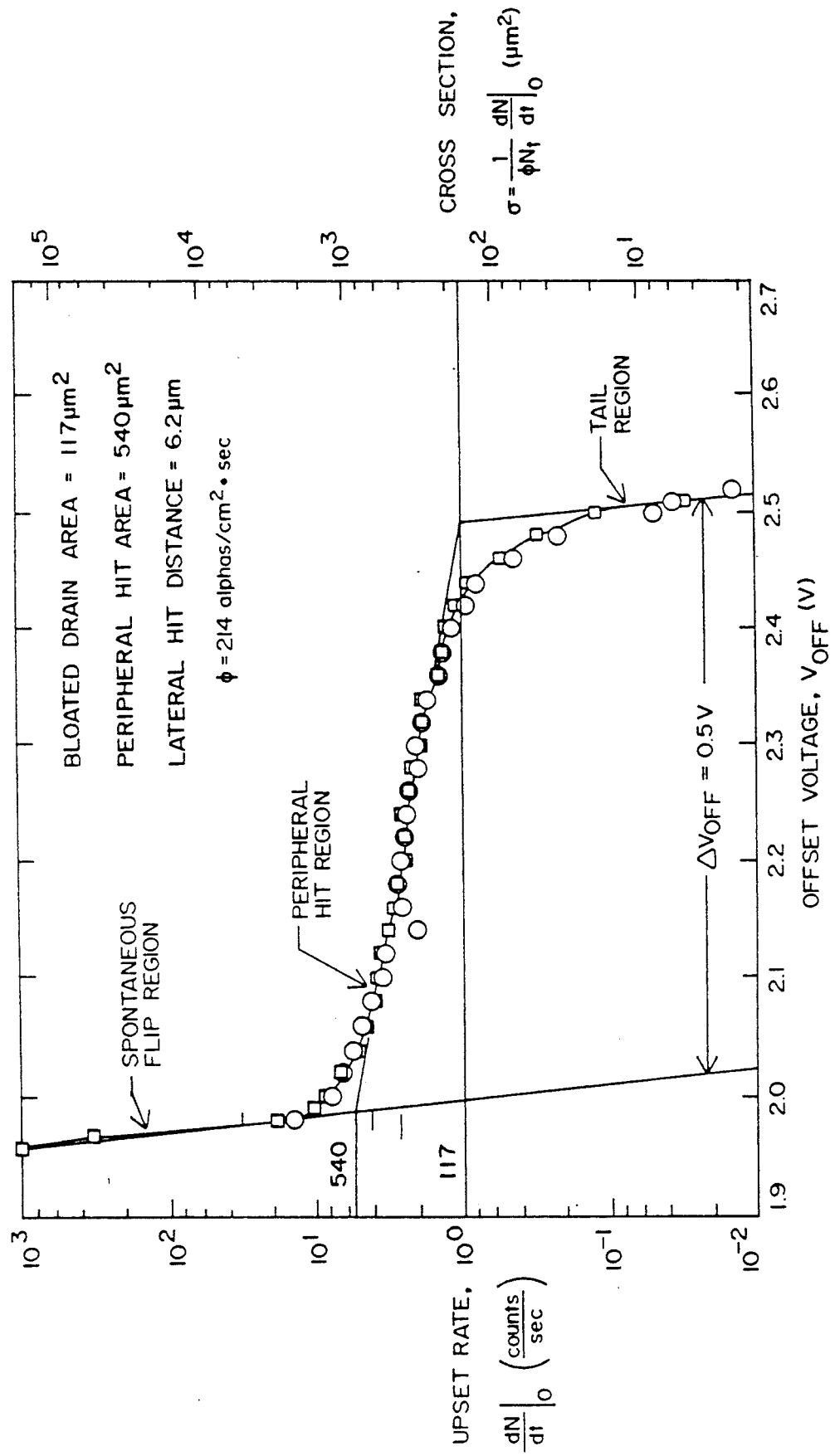
FIG. 15 is a graphical representation of the single event upset rate characteristics induced in the present invention.

When the offset voltage is lowered from 5 V, cells start to flip at 2.46 V and $\sigma$ rises very steeply until about 2.4 V, indicating that the critical charge for all cells has been reached. Then the cross-section increases more slowly until about 2.1 V, crossing the designed sensitive area at about 2.2 V. Subsequently $\sigma$ rises again steeply indicating the onset of spontaneous cell flips. The overall behavior is illustrated in FIG. 15 using another device with slightly different offset voltages.

In order to relate the unexpected "slow" change in the middle region of the purely statistically-defined cross-section more directly to spatial extents, part of the random access memory (RAM) was covered with a mask having a straight edge, which was oriented roughly parallel to the rows or the columns, but crossing them at a small angle $\gamma$, as shown in FIG. 5. The cells along the edge were then partly masked and the remaining cross-section of those cells were a function of their row number or column number along the edge. In this regard, see the graphical illustration of FIG. 6. When the cross-section changed due to change in offset voltage, the "onset" row or column of the cell cross-section along the mask edge shifted by a Noff rows or columns. This shift Noff can be related to a change in spatial extent $\Delta z$ normal to the edge, partially as a function of the pitch P of the roughly square cells. ($\Delta z = $ Noff·P·tan $\gamma$) The angle $\gamma$ can be extracted from the period of the cell cross-section curves m shown in FIG. 6 by the relationship tan $\gamma = 1/m$, where $m < 64$ can be considered the vernier gain determining the resolution of the method.

By that means, continuous shifts in the spatial extents of the cross-section for different offset voltages between, for example, 2.0 V and 2.4 V, were detected in the order of 7 $\mu$m horizontally. As the slowly varying part of the curves in FIG. 6 suggest, a small portion of the cross-section may extend over several cells. The graph of FIG. 6 illustrates alpha-particle normalized upset rates for the memory cells in 4 rows of the SRAM array, partially covered by a straight edge mask. This data was obtained by means of 100 SRAM measurement cycles. Each cycle consisted of writing the entire SRAM to zeros, then sensitizing the SRAM cells to alpha-particle upset for 30 seconds by decreasing the offset voltage and then reading the SRAM to determine which cells had upset. The technique described in conjunction with FIGS. 5 and 6 illustrates that the present invention can be used to investigate single event upset of memory structures by ionizing particles in a simple, inexpensive laboratory set-up.

Figure 7:
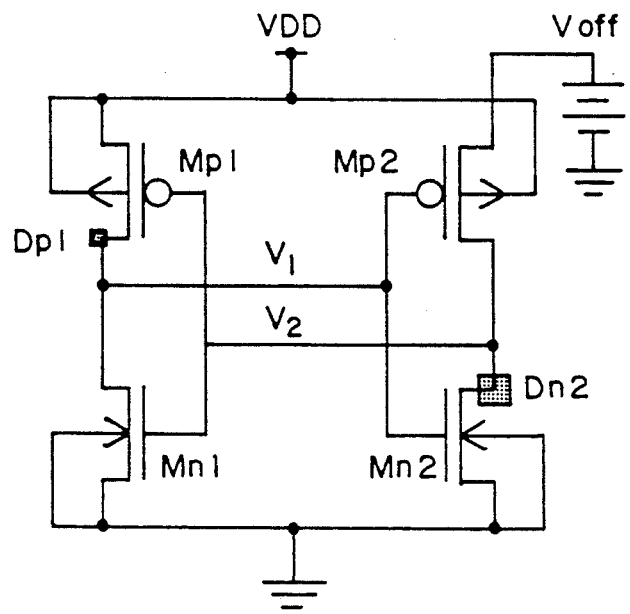
FIGS. 7 and 8 illustrate the schematic and layout diagrams, respectively, of an alpha-sensitive design of the present invention, in which a bloated n-drain of one transistor of the circuit is formed in the P-substrate and an offset voltage connected to the source of a second transistor of the circuit is formed in the N-well.
Figure 9:
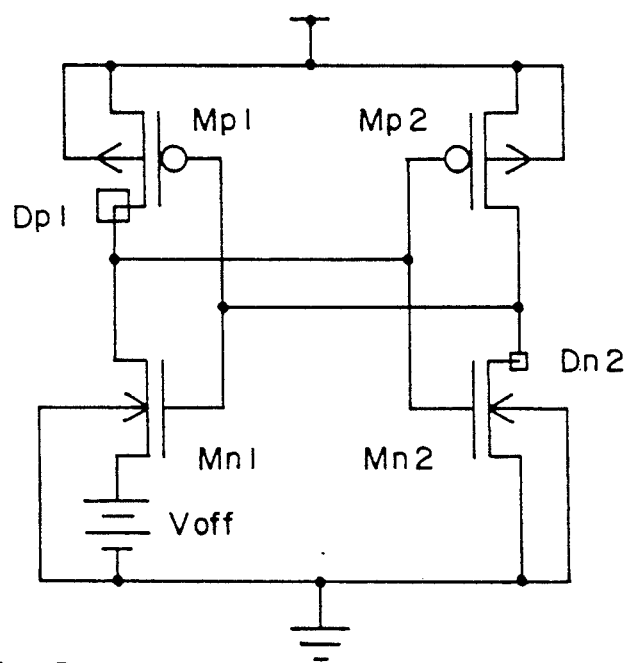
FIGS. 9 and 10 are analogous to FIGS. 7 and 8, but show a different embodiment of the present invention in which the design of the memory cell features a bloated P-drain of a first transistor of the circuit formed in the N-well and an offset voltage connected to the source of a second transistor of the circuit is formed in the P-substrate.
Figure 8:
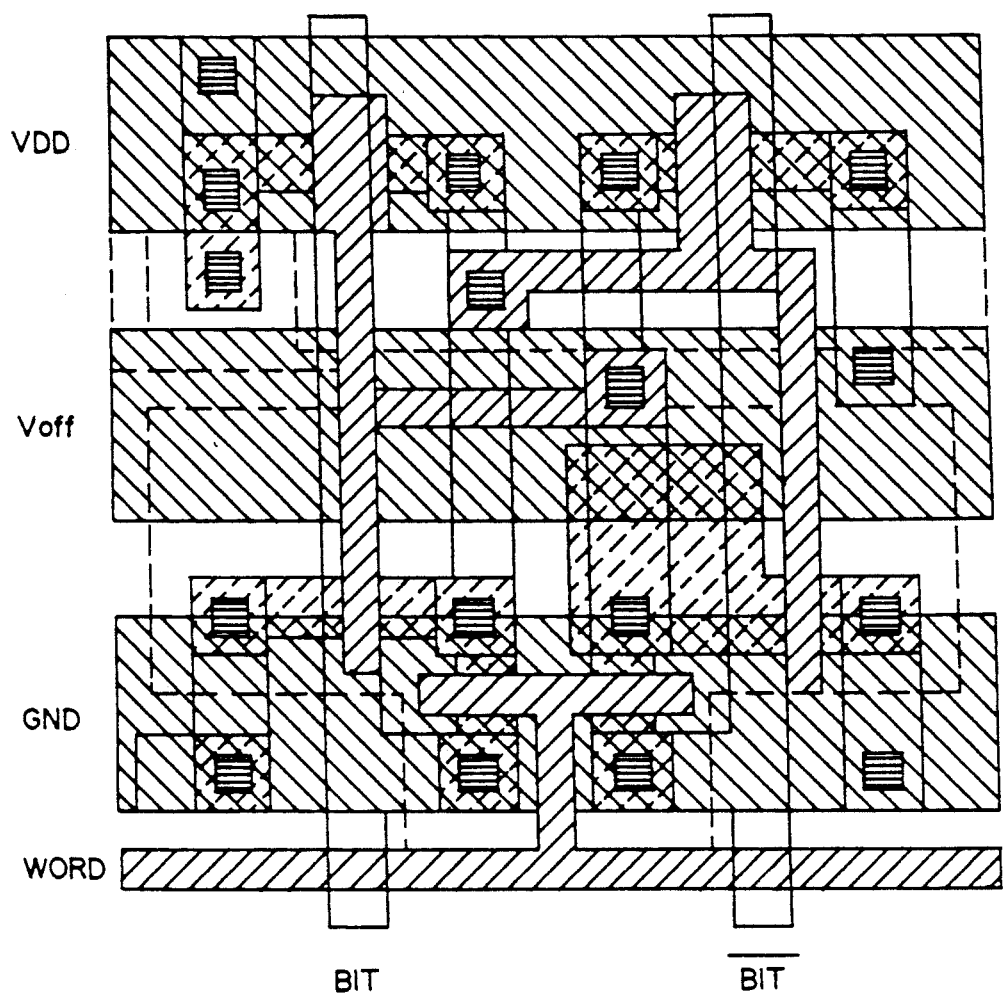
Figure 10:
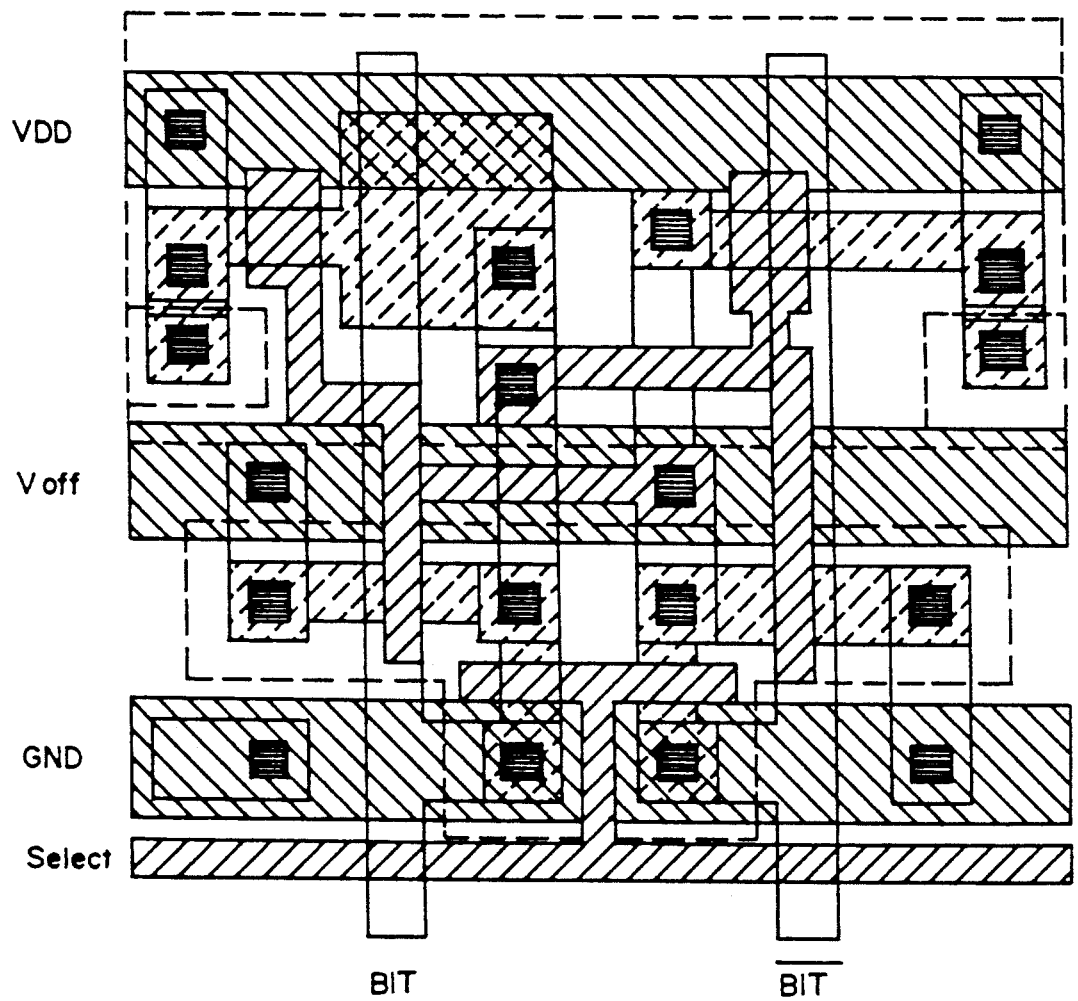
Figure 10:
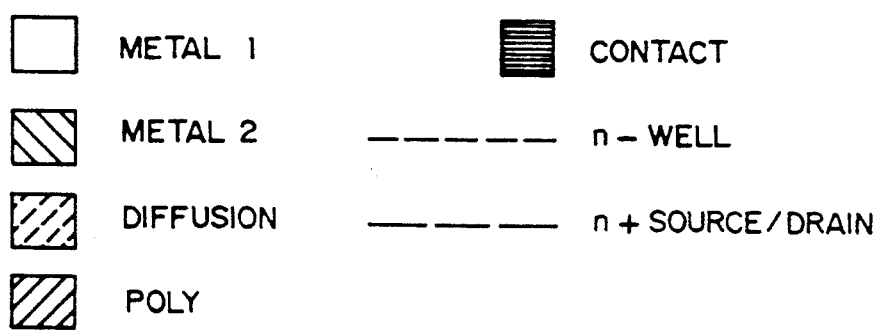

Reference will now be made to FIGS. 7 through 10, which provide circuit and layout drawings respectively, of two alternate configurations of memory cells using the present invention. The memory cell of FIGS. 7 and 8 features a bloated n-drain of Mn2, formed in the p-substrate and an offset voltage connected to the source of Mp2 formed in the n-well. The alternative memory cell design of FIGS. 9 and 10, features a bloated p-drain of Mp1, formed in the n-well and an offset voltage connected to the source of Mn1, formed in the p-substrate. The cell of FIGS. 7 and 8 is a more alpha-sensitive design in that the cell of FIGS. 9 and 10 is resistant to alpha-particle upsets because the n-well truncates the alpha-particle plasma. In view of its superior sensitivity, the circuit of FIG. 7 was reduced to practice as a CMOS 4k-bit test SRAM, wherein the memory cell figure layout of FIG. 8 is designed for 2-$\mu$m CMOS n-well process and has a dimension of 42 $\mu$m by 45 $\mu$m. The alpha-sensitive region is the bloated n-drain in the p-substrate, identified as the diode Dn2, shown in FIG. 7.

The cells of the configuration shown in FIG. 7 are always biased so that the V1-node is low and the V2-node is high. This means that the drain diodes Dp1 and Dn2 are reversed biased and susceptible to upsets by an ion. Because Mp2 is "ON", the V2-node voltage is equal to Voff which is varied from VDD=5 V to 1.9 V. In order to emphasize an ion hit on the Dn2-diode, its area was enlarged to 117 $\mu$m$^2$; whereas, the Dp1-diode was designed with a minimum area of 22 $\mu$m$^2$. The critical dimensions of the cell shown in FIG. 8 in layout configuration, are presented in TABLE 2. The dimensions of the MOSFETs were chosen so that the cell can be operated as a "standard" SRAM when Voff is equal to VDD. In order to minimize the power line noise, VDD; GND and Voff lines were made as wide as possible. This reduces the possibility that one cell will trip another cell from the current transient demanded by the flipping cell.

TABLE 2

| DEVICE | L ($\mu$m) | W ($\mu$m) | Ad ($\mu$m$^2$) |
| --- | --- | --- | --- |
| Mn1 | 2 | 3 | 28 |
| Mn2 | 2 | 4 | 117 |
| Mp1 | 4 | 3 | 22 |
| Mp2 | 4 | 3 | 19 |

Figure 11:
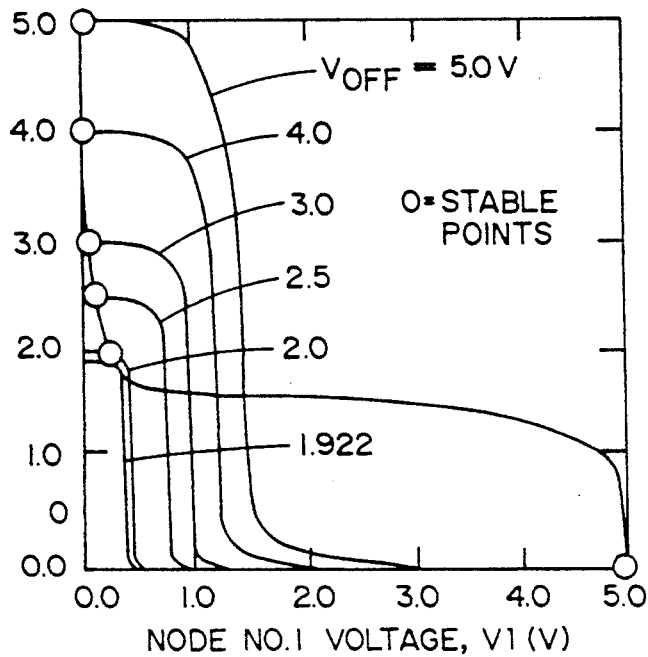
FIG. 11 is a graphical representation of a set of memory cell transfer curves, showing the effect of the offset voltage of the stable points of the cell of the present invention.

The principle of operation of the cell of FIGS. 7 and 8 is illustrated by the transfer curves shown in FIG. 11. When the cell is biased with Voff above 1.9 V, the cell exhibits two stable states. For Voff less than 1.9 V, the cell has only one stable state. As the critical Voff is approached, cells begin to flip according to the distribution in cell parameters. The voltage span for this spontaneous flipping action is about 30 mV for the cells that have been reduced to practice.

Figure 12:
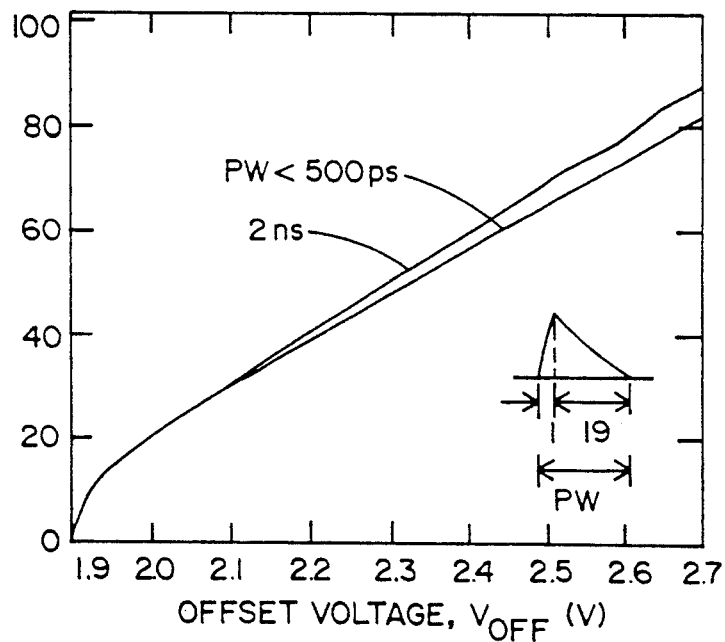
FIG. 12 is a graphical representation showing the manner in which the critical charge of the cell of the present invention was determined.

The critical charge, $\Delta Q$, was determined for this circuit. The V1-node and V2-node capacitances were modeled by fixed metal and polysilicon interconnect capacitances and by the drain depletion capacitances given by their areas and peripheries as well as by specified junction capacitance parameters. A current generator was placed on the V2-node of FIG. 7 and a triangle pulse with a 1:19 rise:fall shape was used to upset the cell. For a given pulse height, transient simulations were performed to 100 ns where the response was compared to VDD/2 to determine if the cell had flipped. The pulse height was adjusted using the binary search algorithm until the difference in charge (area under the pulse) between the flipped and unflipped state differed by less than 0.1 fC. The resulting critical charge $\Delta Q$ versus Voff is shown in FIG. 12. The results were invariant with current pulse widths between 20 ps and 500 ps. Thus, the cell time constant exceeds 500 ps. Because the alpha-particle pulse width is about 200 ps, the charge collected by this circuit depends on current drift along the alpha-particle-induced hole-electron plasma track.

Figure 13:
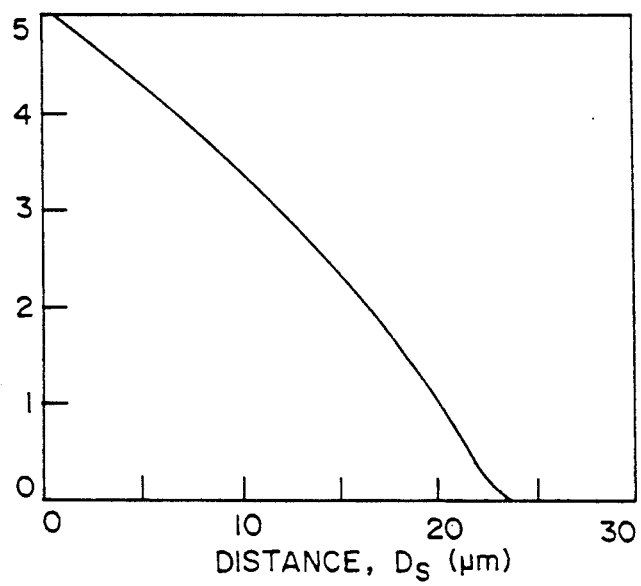
FIG. 13 is a graphical illustration of the energy loss of an alpha-particle passing through silicon.
Figure 14:
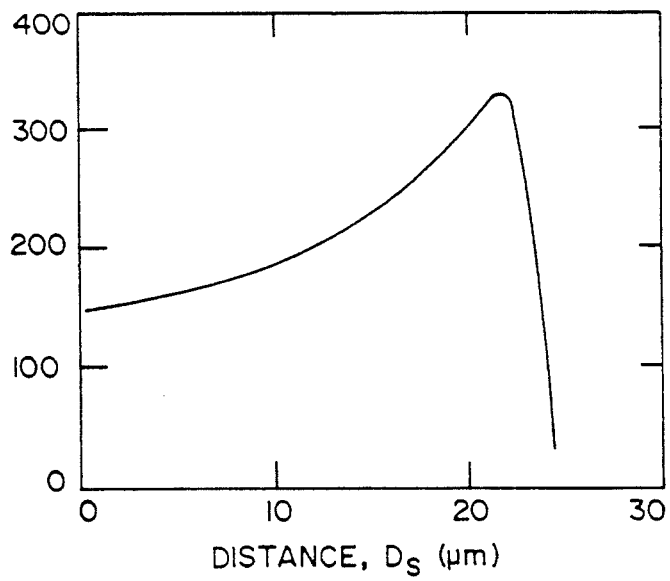
FIG. 14 is a graphical representation of the energy loss per unit length of an alpha-particle in silicon.
Figure 17:
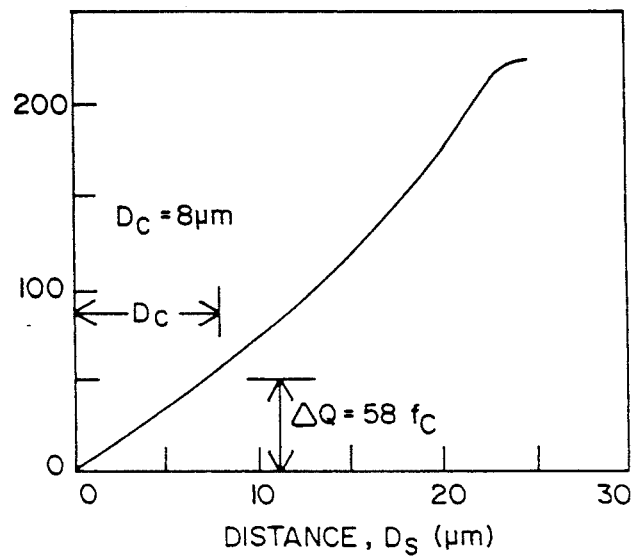
FIG. 17 is a graphical representation of the deposited charge profile of an alpha-particle in silicon, used to explain characteristics of the present invention.

The energy loss of an alpha-particle passing through silicon is shown in FIG. 13. This figure shows that a 5 MeV alpha-particle has a range of 23.7 $\mu$m. The differential of the energy curve leads to the linear energy LET curve shown in FIG. 14. This curve shows that as the particle penetrates the silicon, its LET increases up to the Bragg peak and then falls to zero. The integral of the LET curve leads to the deposited charge, $\Delta Q$, the curve of which is shown in FIG. 17. This indicates that the 5 MeV alpha-particle deposits nearly 225 fC in Silicon.

In the experiments described hereinafter, a 1 $\mu$Ci Po-208 alpha-particle emitter was used. This source was place 32.5 mm above the SRAM cell. This is very close to the range of the alpha-particles in air of 35.2 mm. The cell and the source were placed in a vacuum chamber. The flux at the SRAM cell, measured with a pin diode, was 214 alphas/cm$^2$ seconds. The particle vacuum pressures were measured using a Wallace & Tiernan FA 112 pressure gauge. The offset voltage was applied for a duration that allowed 1 to 30 upsets to occur, and this measurement was repeated 30 times and averaged to give results with deviations less than 18 percent for data larger than 0.01 counts/sec and 6 percent for data larger than 0.2 counts/sec. For this experiment the "ON" time for the offset voltage varied from 1 to 60 seconds. The response of the cell follows the detector equation where it is assumed that all the memory cells are initially placed in the same state:

$$\frac{dN}{dt} = \phi\sigma(N_t - N)$$

Here N is the number of flipped cells at time t, $N_t = 4096$ is the total number of cells in the SRAM, $\phi$ is the alpha-particle flux, and $\sigma$ is the cell cross-section. The cross-section is determined from the initial slope for N approaching zero:

$$\sigma = \frac{1}{\phi N_t} \left.\frac{dN}{dt}\right|_o$$

The response of the SRAM is shown in FIG. 15 for alpha-particles in a vacuum. Three regions are apparent in FIG. 15. Region 1. the spontaneous region, is governed by cell parameter distributions and indicates that the transfer curves, as seen in FIG. 11, no longer overlap (Voff < 1.9 V). Region 2 is termed the peripheral hit region because the cross-section exceeds the design cross-section of 117 $\mu$m$^2$. For this cell, the extent of the peripheral hit area is 540 $\mu$m$^2$. Assuming the bloated drain is a square shaped 117 $\mu$m$^2$ and the peripheral hit region is a square-shaped 540 $\mu$m$^2$, then the lateral hit distance is 6.2 $\mu$m$^2$. Region 3 is the tail region. In this region the upset rate falls with a slope that is governed by the straggle of the alpha particles in silicon.

As seen in FIG. 15, the $\Delta$Voff is 0.5 V. From FIG. 12, this leads to a critical charge of $\Delta Q = 58$ fC. This leads to a collection depth, Dc, of 8 $\mu$m, as determined from FIG. 17. The Dc value was determined from the slope of the curve in FIG. 14. This does not allow for the reductions in the energy of the alphas by the overlayers of the SRAM. Because the change in the slope of the charge curve shown in FIG. 17 is small, ignoring the thickness of the overlayer is reasonable.

Figure 16:
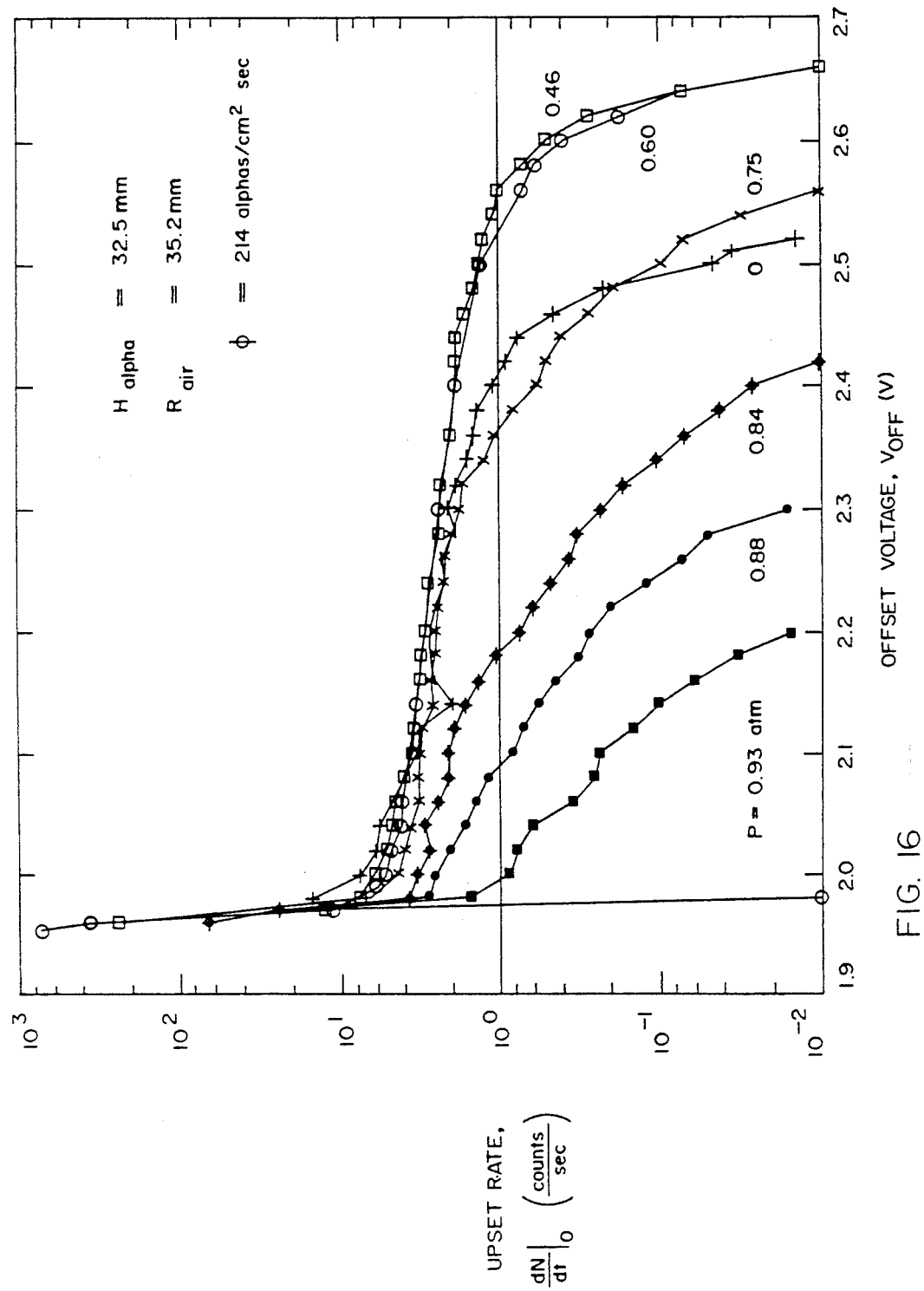
FIG. 16 is a graph similar to that of FIG. 15, but showing data taken at different vacuum pressures.
Figure 18:
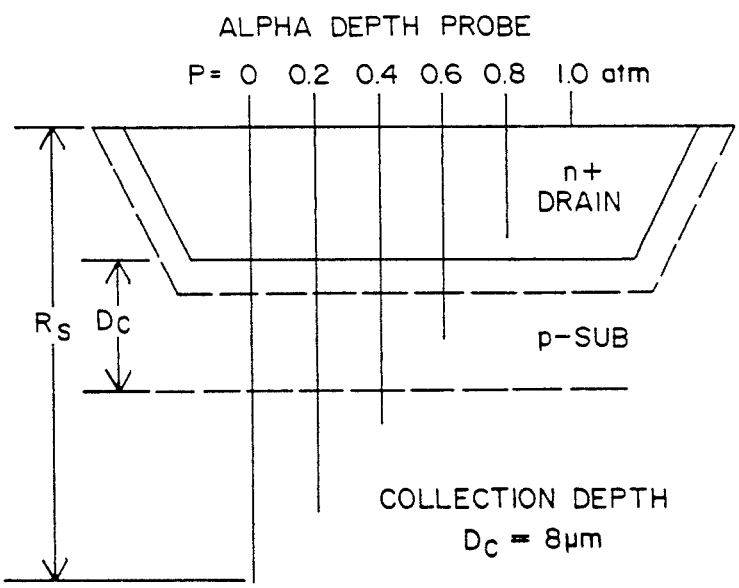
FIG. 18 is a graphical representation used to explain the behavior of alpha-particle variations due to energy loss in air before particles reach the silicon of the SRAM of the present invention.

The response of the SRAM, as a function of partial vacuum, is shown in FIG. 16. This behavior can be explained qualitatively as shown in FIG. 18. For P=0, the alpha-particles penetrate 23.7 $\mu$m, but as determined from the vacuum results, only 8 $\mu$m are effective in supplying charge to the junction. As the air is introduced into the chamber, the energy of the alpha-particles as they enter the silicon is reduced, which reduces the penetration of the alpha-particles into the silicon. For this experiment, where the alpha-particle source is placed approximately at the range of the alphas in air, the upset rate goes to zero at atmospheric pressure.

Figure 19:
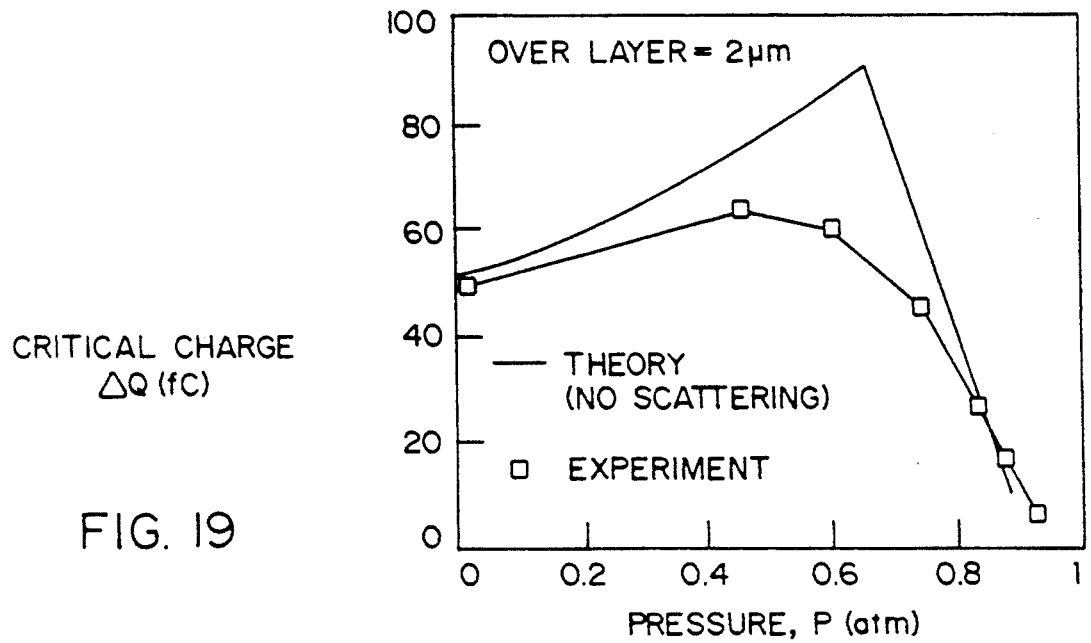
FIG. 19 is a graphical representation of the variation of critical charge with pressure, used to explain the upset rate characteristics shown in FIG. 16.

The data shown in FIG. 16 is analyzed in FIG. 18. The voff values were determined at an upset rate of 1 count/second. These were then converted to critical charge using the graph of FIG. 12. The experimental results are plotted in FIG. 19. A simple theoretical model was fitted to the data assuming an overlayer of 2 $\mu$m and a collection depth of 7 $\mu$m. This model assumes that the collection depth "slides" along the critical charge curve (see FIG. 12) as the pressure changes from vacuum to atmospheric. As the collection depth slides along the curve, the LET increases and therefore the $\Delta$Voff increases. Once the end of the range is reached, the charge is reduced and thus $\Delta$Voff decreases.

These experiments demonstrated that the SRAM of the present invention was in fact made sensitive to alpha-particles through the use of a cell offset voltage, which allows a bench-level characterization in a laboratory setting. Experimental data was linked to alpha-particle interaction physics and circuit simulations through the alpha-particle collection depth. The collection depth was determined by two methods and found to be about 7 $\mu$m. In addition, alpha-particles that struck outside the bloated drain were able to flip the SRAM cells. This lateral charge collection was observed to be more than 6 $\mu$m.

The cross-section of the detector inverter in two alternate designs of the present invention is shown in FIG. 20. In the embodiment illustrated in FIG. 20a, the enlarged drain is formed in the n-MOSFET in the p-substrate and in the design of FIG. 20b, the enlarged drain is formed in the p-MOSFET in the n-well. During the write cycle of the test SRAM of the present invention, all the cells are biased into the same state where the enlarged drain is reverse biased. During this cycle, the offset voltage Voff is at its read/write bias, which is VDD for FIG. 20a and GND for FIG. 20b. Then Voff is carefully changed so as to reduce the reverse bias on the enlarged drain. This places the SRAM into its "STARE" cycle during which alpha-particles can upset the cells. At the end of the "STARE" cycle, the offset voltage is restored to its read/write bias and the number of upset cells is read.

Figure 21:
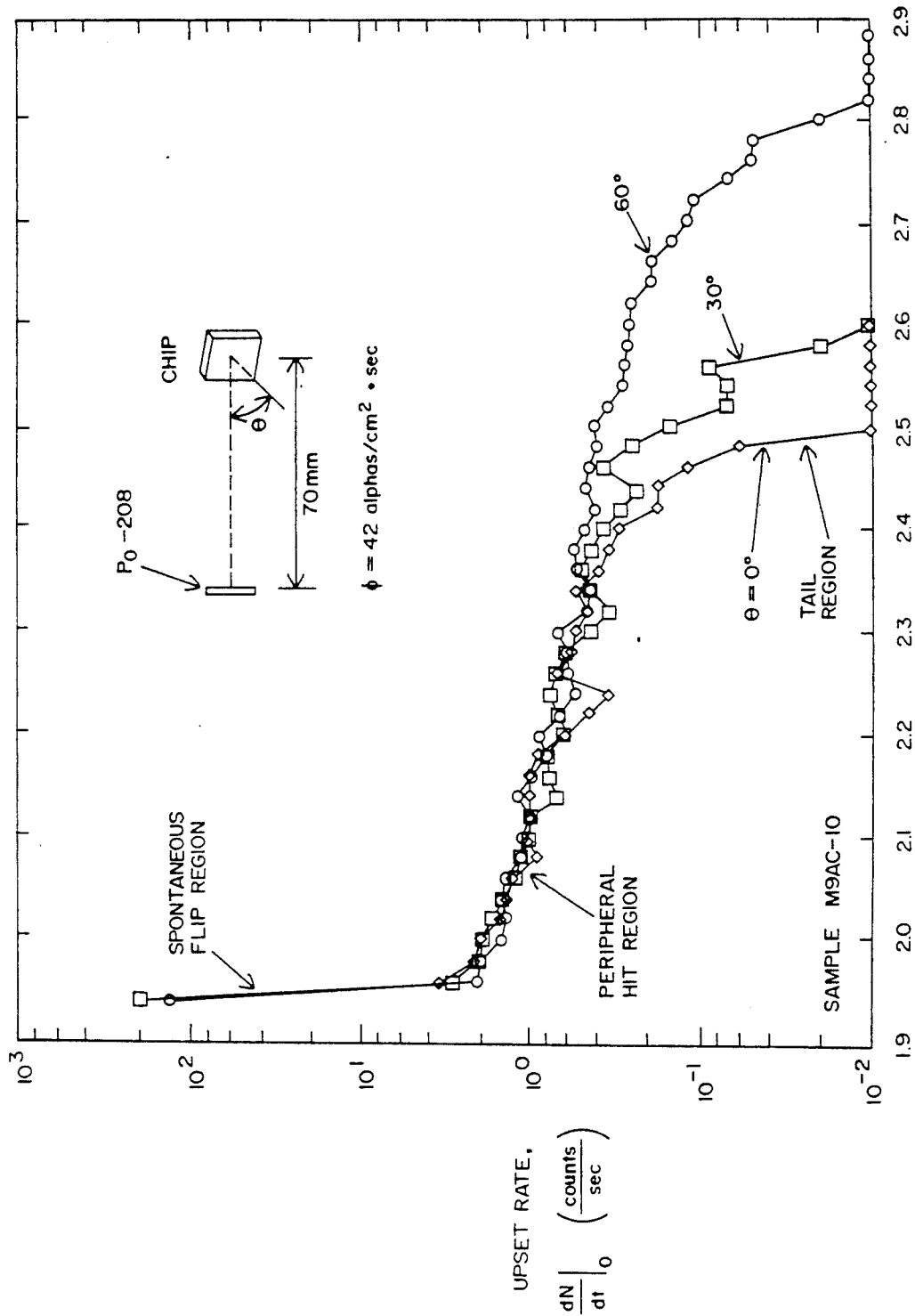

The characteristic curve for characterizing alpha-particle tracks in CMOS/bulk circuits as shown in FIG. 21. This curve shows the bit flip rate versus Voff for three different angles of incidence of alphas from a Po-208 source. As indicated in FIG. 21, the curve has three regions: the spontaneous flip region, the peripheral flip region, and the tail region. The intersection of the peripheral hit region and the tail region corresponds to the physical cross-section of the enlarged drain area for zero degree alphas. The collection depth for this SRAM was determined to be 8 $\mu$m below the enlarged n-drain. The data for 30 and 60 degrees indicates that the threshold for upsetting the SRAM increases with the angle of incidence of the alphas. The angle of incidence of the particles is known to increase the collection depth of incident ions.

In most experiments on circuits, the angle of incidence is usually limited by the side wall of the package to 70 degrees. The SRAM illustrated in FIG. 20b could not be upset by alphas, which were incident normal to the surface. This is because the alpha-particle track is truncated by the n-well. However, these SRAMs could be upset if the incident angle is made very shallow. An experiment was devised where the alpha source was placed close to the SRAM and masked by a pinhole, as shown in FIG. 22. None of the cells which were directly below the source flipped. Only those cells toward the corner of the SRAM flipped where the angle of incidence of the alphas was shallow enough to deposit the charge required to flip the cells. FIG. 22 thus demonstrates the use of the cells of the present invention as an angle detector. Thus, when the sensitive diodes are diffused into a "WELL", upsets are only detected for shallow angles. Particles which traverse the diode "WELL" structure normal to the surface, do not deposit enough charge to trip the cells because the "WELL" junction truncates the charge.

Figure 25:
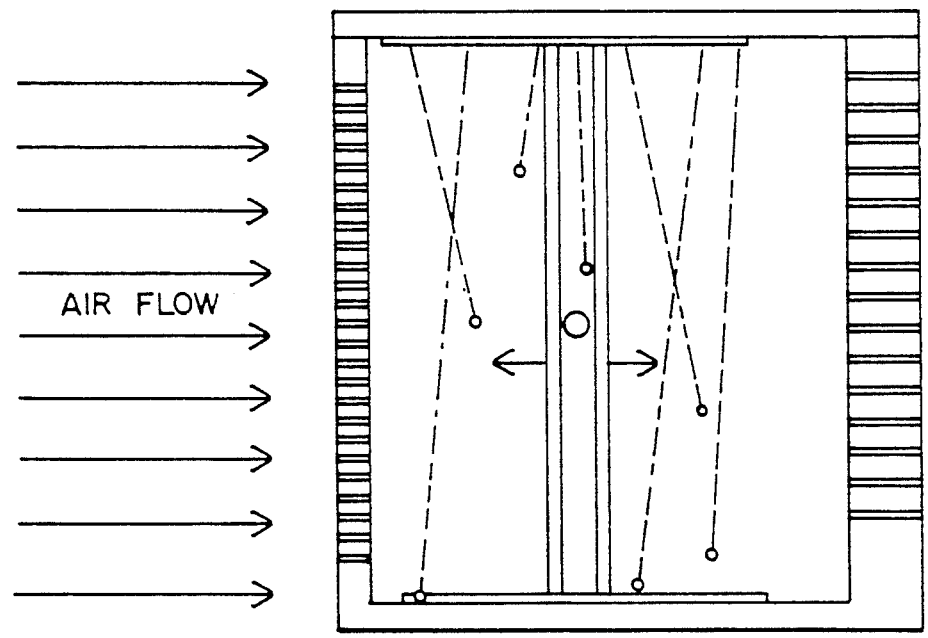
FIG. 25 is a representative sketch of the use of the SRAM/alpha-particle detector of the present invention as a pressure sensor.
Figure 23:
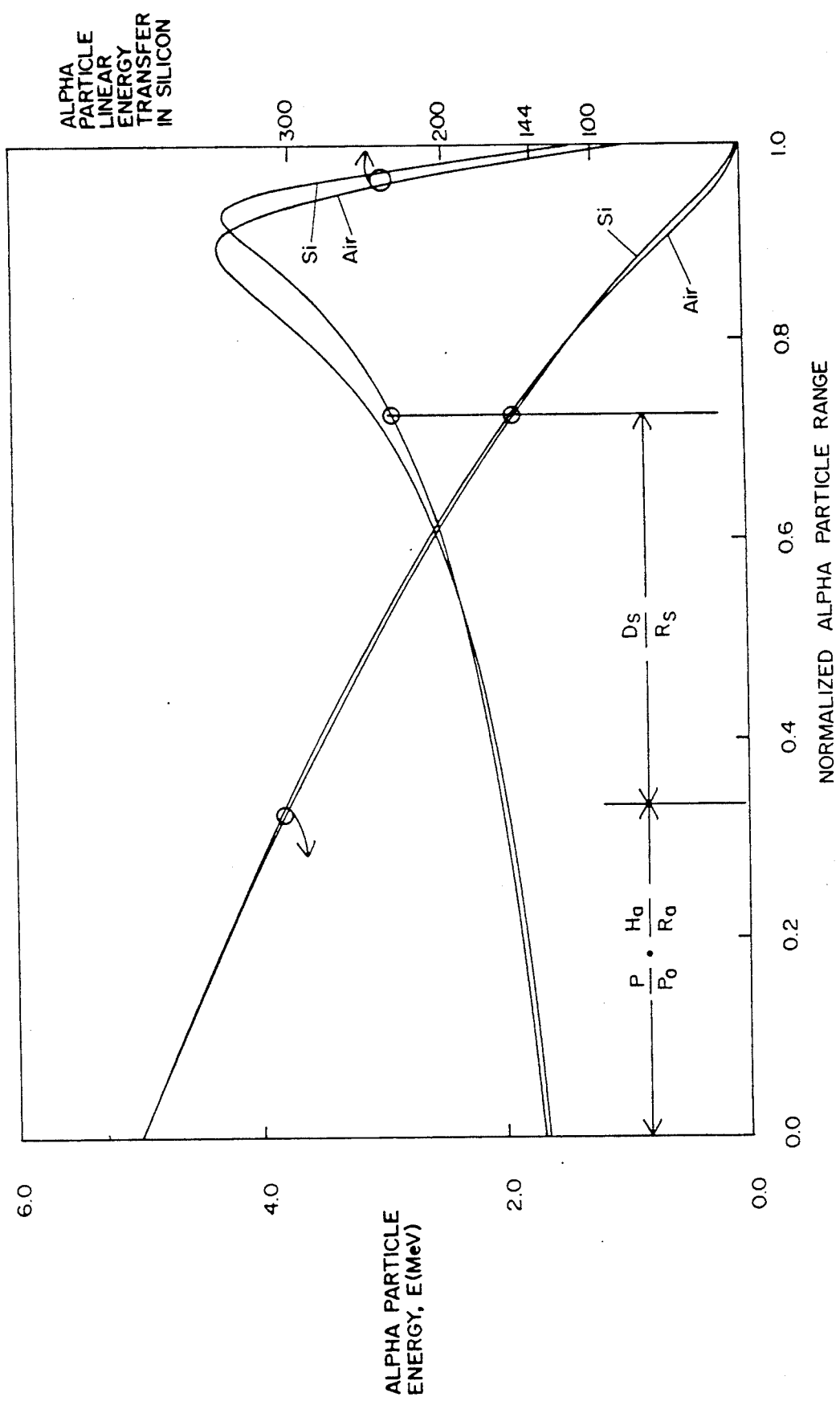
FIG. 23 is a graphical representation of normalized alpha-particle range, plotted against linear energy transfer of the alpha-particles and the amount of charge deposited for both air and silicon media.
Figure 24:
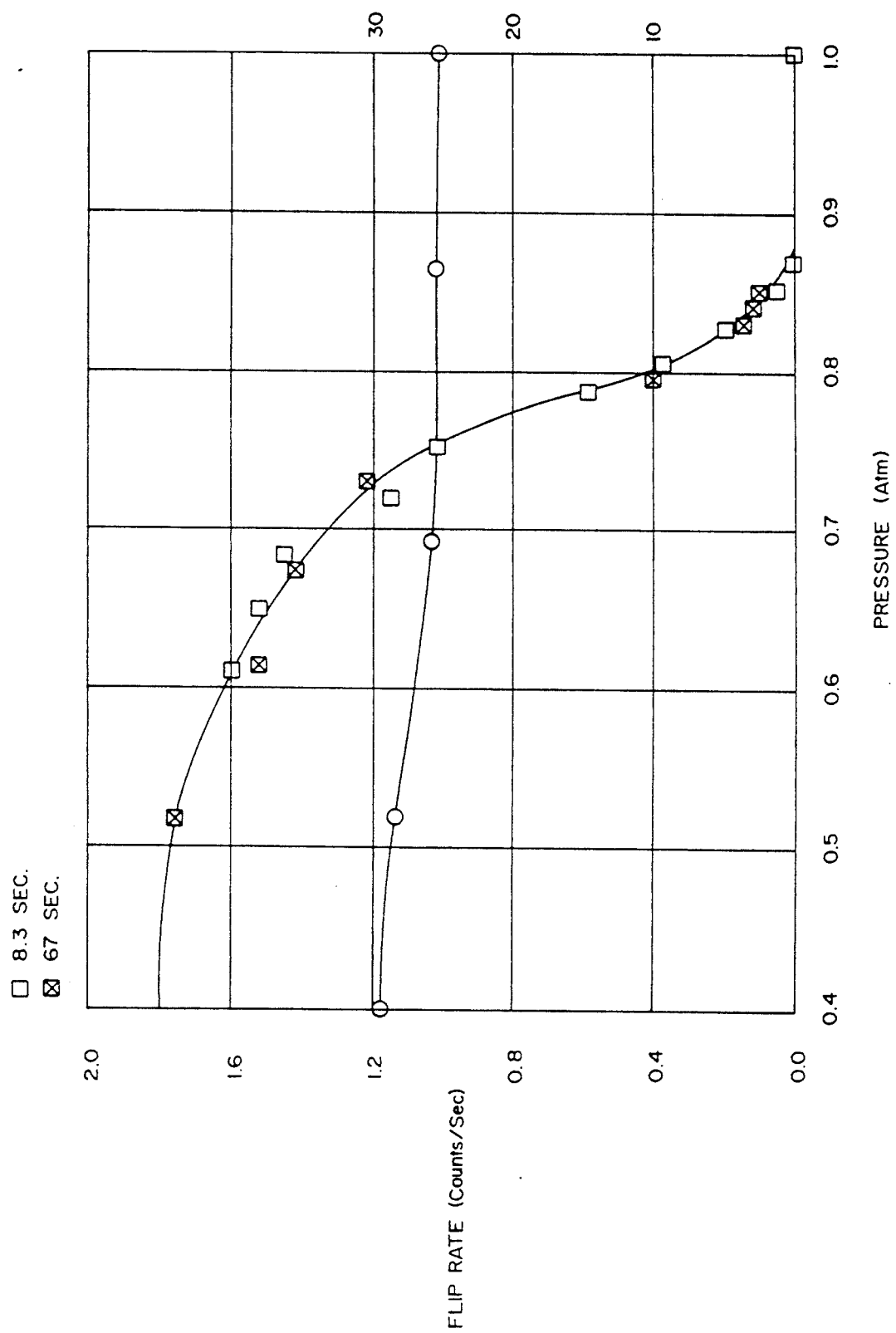
FIG. 24 is a graphical representation of the pressure sensitivity of the SRAM cell, illustrating the flip rate for the alpha-particle source placed at two different distances from the cell.

The use of the present invention as a pressure sensor shall now be discussed in conjunction with FIGS. 23 through 25. The pressure sensitivity of the sensor of the present invention is based on the amount of charge deposited in the silicon at or near the sensitive drain by an alpha-particle. The amount of charge deposited depends on the range and linear energy transfer (LET) of the alpha-particles. In FIG. 23, the alpha-particle range is normalized to its range in either air or silicon. As seen in FIG. 23, the energy versus normalized range and LET versus normalized range curves are very close for both air and silicon. As the alpha-particles collide with the air, they lose energy and thus their linear energy transfer increases until the Bragg peak is reached.

The pressure sensitivity of the SRAM cell of the present invention is illustrated in FIG. 24. The two curves shown in the graph of FIG. 24 illustrate the flip rate for the alpha-particle source placed 1.0 and 3.0 centimeters, respectively, from the SRAM cell. For the 1.0 cm case the response is almost flat. However, for the 3.0 cm case, the response demonstrates the pressure sensitivity of the SRAM/alpha-particle sensor of the present invention.

FIG. 25 illustrates a pressure sensor design using the present invention. This illustrative design integrates the SRAM/alpha-particle sensor into a three chamber configuration to detect the upstream pressure, the tail-stream pressure, and the atmosphere pressure. These different pressures are useful because the difference between the up stream pressure and the tail stream pressure is proportional to the velocity of the air flow and the difference between the upstream pressure and the atmosphere pressure is proportional to the air mass of the air flow. As seen in FIG. 25, the air flow is from left to right. The top interior surface of the sensor apparatus of FIG. 25 is provided with an alpha-particle emitter, such as Americium. The sensor of the present invention is placed at the bottom interior surface along all three chambers.

The characterization of the single-event-upset (SEU) resistance of a latch requires four parameters:

(a) The sensitive-diode critical upset charge, Qc;
(b) the sensitive-diode area, A;
(c) the particle collection depth, Dc; and
(d) the particle Linear Energy Transfer, LET.

These parameters come from simulation, device layout, experimental results from particle testing, and atomic physics, respectively. The upset rate (in upsets per bit-day) for a latch can be calculated from the Petersen Equation which was developed for the 10 percent worst case Cosmic Ray environment at geosynchronous orbit:

$$R = 5 \times 10^{-10} A(\mu m^2) [Dc(\mu m)/Qc(pC)]^2.$$

In the above equation, the most difficult parameter to obtain is the particle collection depth, Dc. In the methodology presented here, the collection depth is determined from heavy ion testing of a specially designed test SRAM. The SRAMs are designed to be sensitive to low LET particle such as alpha-particles. This allows the immediate, low cost characterization of SEU susceptibility and replaces the time delayed and costly cyclotron testing.

For the memory cells disclosed herein, the offset voltage varied from 5.0 V to 1.9 V before the cells spontaneously flipped to the other state. Measurements on 2-$\mu$m CMOS n-well 4k SRAMs, indicated that a Po-208 5.1-MeV alpha particle source was able to flip the memory cells for offset voltages between 1.9 and 2.5 V, For an offset voltage of 2.5 V and critical charge of 58 fC, the collection depth was found to be 8 $\mu$m. For a bloated drain area of A=117 $\mu$m², Qc=58 fC, and Dc=8 $\mu$m, the calculated upset rate is 1.1E-3 upsets/bit-day and the LET is 0.71 MeV-cm²/mg.

The upset rate can now be calculated for a "normal" cell with a minimum drain area of A=28 $\mu$m and no offset voltage (i.e. 5.0 V). Under these conditions the critical charge is 156 fC. Assuming a collection depth of 8 $\mu$m as determined above, the calculated upset rate is $3.7 \times 10^{-5}$ upsets/bit-day and the LET is 1.9 MeV-cm²/mg.

The above scenario represents the proposed methodology for calculating the SEU resistance of latches used in ASIC design. This methodology calls for test latches to be designed with selected nodes disconnected from the power lines and connected to offset voltage lines.

It will now be understood that what has been disclosed herein comprises a particle sensor array which in a preferred embodiment comprises static random access memory having a plurality of ion-sensitive memory cells, each such cell comprising at least one pull-down field effect transistor having a sensitive drain surface area and at least one pull-up field effect transistor having a source connected to an offset voltage. The sensitive drain surface area and the offset voltage are selected for memory cell upset by incident ions such as alpha-particles. The static random access memory of the present invention provides a means for selectively biasing the memory cells into the same state in which each of the sensitive drain surface areas is reverse biased and then selectively reducing the reverse bias on these sensitive drain surface areas for increasing the upset sensitivity of the cells to ions. The resulting selectively sensitive memory cells can be used in a number of applications. By way of example, they can be used as a densitometer for determining the density of a medium, the medium being of a type which effects the energy of ions passing through the medium as a function of the medium's density. The present invention can also be applied for use in air pressure measurement. A sensor of the present invention for use in measuring air pressure would be separated from a source of ions within a chamber in which the air pressure is to be measured. The ions are selected to have an energy level and/or distance from the sensor which is dependent upon the air pressure. The present invention can also be used for measuring the linear energy transfer of ion particles, as well as a device for assessing the resistance of CMOS latches to Cosmic Ray induced single event upsets. The characterization of static random access memories due to ion induced upsets is essential to evaluating the susceptibility of such memories, as well as other storage devices such as latches and registers to Cosmic Ray upsets without requiting a heavy ion source such as a Cyclotron, which would otherwise render such evaluations time consuming, expensive and error prone.

Those having skill in the art to which the present invention pertains, will now, as a result of the applicants' teaching herein, perceive various modifications and additions which may be made to the invention. By way of example, the specific architectural configuration of the static random access memories shown herein, as well as the number of transistors used therein, may be readily modified while still preserving the increased ion induced upset sensitivity of the present invention. Furthermore, certain semiconductor surfaces may be made sufficiently sensitive in some applications without bloating the area of such surfaces and by relying exclusively on the offset voltage. Accordingly, all such modifications and additions are deemed to be within the scope of the invention, which is to be limited only by the claims appended hereto and their equivalents.

We claim:
1. An ion detector comprising:
   a metal-oxide-semiconductor field-effect transistor (MOSFET) having a bloated drain surface area forming a detector diode;
   a voltage source providing a controlled bias voltage for reverse biasing said detector diode; and
   means for applying said bias voltage to said detector diode through a pull-up component for selectively altering said reverse biasing whereby to selectively alter the sensitivity of said detector to incident ions.
2. The detector recited in claim 1 wherein said drain is formed in the p-substrate of an n-MOSFET.
3. The detector recited in claim 1 wherein said drain is formed in the n-well of a p-MOSFET.

* * * * *